United States Patent [19]

Krämer et al.

[11] 4,412,176
[45] Oct. 25, 1983

[54] TESTING METHOD FOR DETERMINING THE MAGNETIC PROPERTIES OF FERROMAGNETIC POWDERS

[75] Inventors: Horst Krämer; Heinrich Fassbender, both of Hürth, Fed. Rep. of Germany

[73] Assignee: Hoechst Aktiengesellschaft, Frankfurt am Main, Fed. Rep. of Germany

[21] Appl. No.: 234,986

[22] Filed: Feb. 17, 1981

[30] Foreign Application Priority Data

Feb. 22, 1980 [DE] Fed. Rep. of Germany ....... 3006626

[51] Int. Cl.$^3$ ..................... G01R 33/12; G01N 27/74
[52] U.S. Cl. .................................... 324/204; 324/228
[58] Field of Search ............... 324/200, 204, 214–216, 324/228, 226, 377; 434/301

[56] References Cited

U.S. PATENT DOCUMENTS

| | | | |
|---|---|---|---|
| 2,501,615 | 3/1950 | Pugh | 324/200 X |
| 2,524,804 | 10/1950 | Irby | 434/301 |
| 3,181,059 | 4/1965 | Mohnkern | 324/214 |
| 3,443,214 | 5/1969 | Meservey | 324/214 |
| 3,663,731 | 5/1972 | Ofwerstrom | 434/301 |

*Primary Examiner*—Gerard R. Strecker
*Attorney, Agent, or Firm*—Connolly & Hutz

[57] ABSTRACT

The invention relates to a method permitting the magnetic properties of ferromagnetic powders which are used for the preparation of heavy media for the float-sink dressing of minerals, to be tested. To this end, the invention provides for the ferromagnetic powder to be magnetized in a magnetic steady field at a field strength within the range 600 to 1000 amperes per cm and the magnetized ferromagnetic powder to be demagnetized in a cyclicly decreasing magnetic alternating field at a field strength within the range 1000 to 1500 amperes per cm. Next, the ferromagnetic powder so pretreated is heaped up, in the center portion of a circular plate made from dielectric material and the circular plate is placed on an iron core-provided coil. An alternating current voltage of 180 to 260 volts is applied to the coil, thereby effecting the occurrence of alternating fields of 180 to 220 amperes per cm in the center portion of the circular plate. The ferromagnetic powder heaped up is observed for the figure it is forming under the influence of the alternating fields. The formation of a closed figure around the center portion of the plate indicates unlimited qualification of the ferromagnetic powder for use in a heavy medium suspension.

2 Claims, 4 Drawing Figures

TESTING METHOD FOR DETERMINING THE MAGNETIC PROPERTIES OF FERROMAGNETIC POWDERS

The present invention provides a testing method for determining the magnetic properties of ferromagnetic powders for use as heavy media in the float-sink dressing of minerals.

Float-sink dressing is a process which is customarily used for separating minerals of different density from each other with the use of an aqueous suspension of heavy medium, i.e. with the use of a so-called heavy medium suspension with a specific density which lies between the densities of the respective minerals which are to be separated from each other. As a result, upon the introduction of the mixture of minerals into the heavy medium suspension, it is possible for mixture constituents of lower density to float thereon, and for mixture constituents of higher density to sink down and settle therein. Needless to say portions of heavy medium adhere to the floating and settled materials. For recovery, the materials are separated from one another and subjected to treatment with a water jet, the heavy medium being then obtained in the form of a dilute suspension. The small particle size makes it impossible for the heavy medium to be separated, e.g. by filtration from such dilute suspension. This is the reason why ferromagnetic powders are preferentially used as heavy media as these can be recovered from a dilute suspension by magnetic separation and can additionally be freed from unmagnetic contaminants. Magnetite has more particularly been used for making heavy medium suspensions of relatively low specific density, and ferrosilicon with 8 to 25% Si therein has been used for making heavy medium suspensions of higher specific density, the heavy medium, which is incidentally made by a spray or grinding process, being employed in the form of particles with a size within the range about 0.001 to 0.4 mm. Magnetically separated heavy medium is invariably magnetized, i.e. constitutes powder which is unable to produce a stable suspension. In other words, any heavy medium which is so recovered has to be demagnetized for re-use in the preparation of fresh heavy medium suspensions. The recovered heavy medium can be demagnetized by heating it to temperatures higher than its Curie point or, less expensively, by demagnetization in an alternating field. Depending on the available production facility, on quality and quantity of the feed material, it is possible to produce pulverulent heavy media with more or less good magnetic properties, which naturally influence their demagnetizability in the alternating field. Especially in those cases in which the heavy medium (e.g. ferrosilicon) has further corrosion-improving materials (e.g. carbon together with phosphorus, copper, aluminum or similar materials; cf. German Patent Specification Nos. 972,687 and 2,222,657) admixed with it, the resulting multimaterial system cannot be said to have well-defined magnetic properties.

The present invention now provides a method permitting ferromagnetic powders to be readily tested for their qualification for use in the preparation of heavy medium suspensions for the float-sink dressing of minerals, which comprises:

(a) magnetizing the ferromagnetic powder in a magnetic steady field at a field strength within the range 600 to 1000 amperes per cm;

(b) demagnetizing the magnetized ferromagnetic powder in a cyclicly decreasing magnetic alternating field at a field strength within the range 1000 to 1500 amperes per cm;

(c) heaping up, in the center portion of a circular plate made from dielectric material, 0.2 to 0.5 g of the ferromagnetic powder pretreated as described under (a) and (b);

(d) placing the circular plate described under (c) on an iron core-provided coil, applying an alternating current voltage of 180 to 260 volts thereto, thereby effecting the occurrence of alternating fields of 180 to 220 amperes per cm in the center portion of the circular plate; and (e) observing the heaped ferromagnetic powder for the figure it is forming under the influence of the alternating fields according to (d), the formation of a closed figure around the center portion of the plate indicating unlimited qualification of the ferromagnetic powder for use in a heavy medium suspension. Glass can, for example, be used as the dielectric material. The method of this invention permits ferromagnetic powder to be tested in simple fashion as to whether it is magnetizable enough for reliable separation from an aqueous phase and whether it is magnetically soft enough for satisfactory demagnetization.

An apparatus for carrying out the present testing method is shown diagrammatically in the accompanying drawing, of which:

Figure 1:
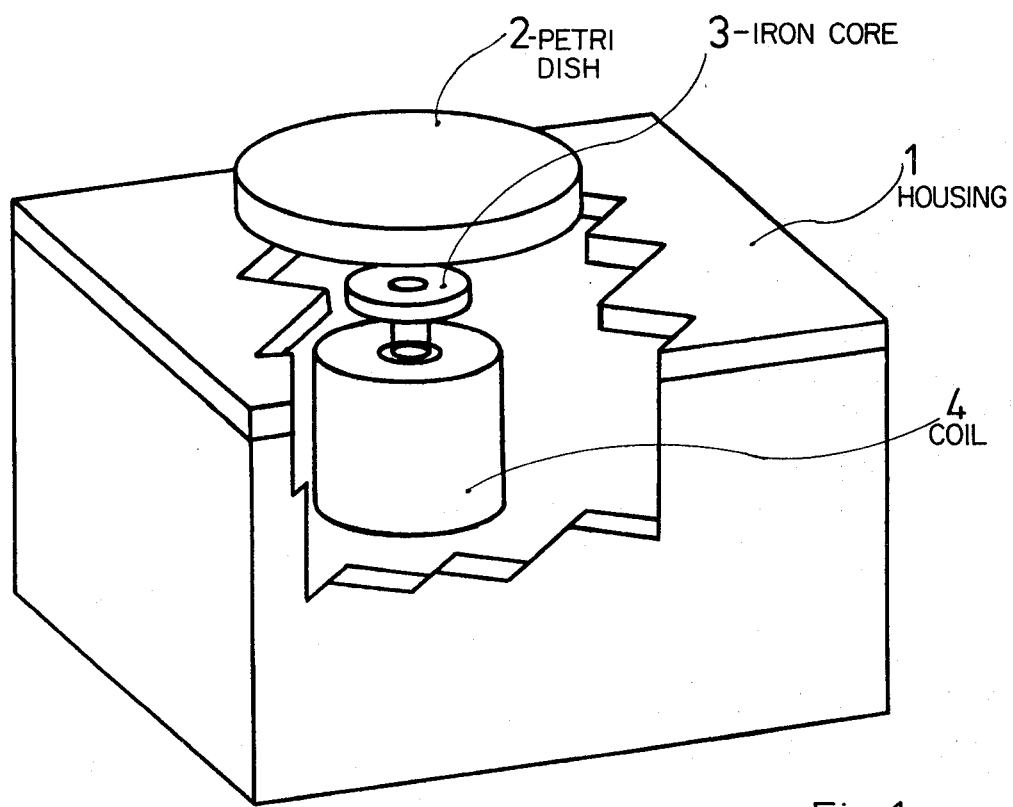
FIG. 1 is a perspective view, partially in section, of the apparatus used for carrying out the present process.

FIG. 1 shows a housing 1 in which there is a coil 4 with an iron core 3, the latter having a Petri dish 2 of glass as a circular plate centrically placed thereon.

Figure 2:
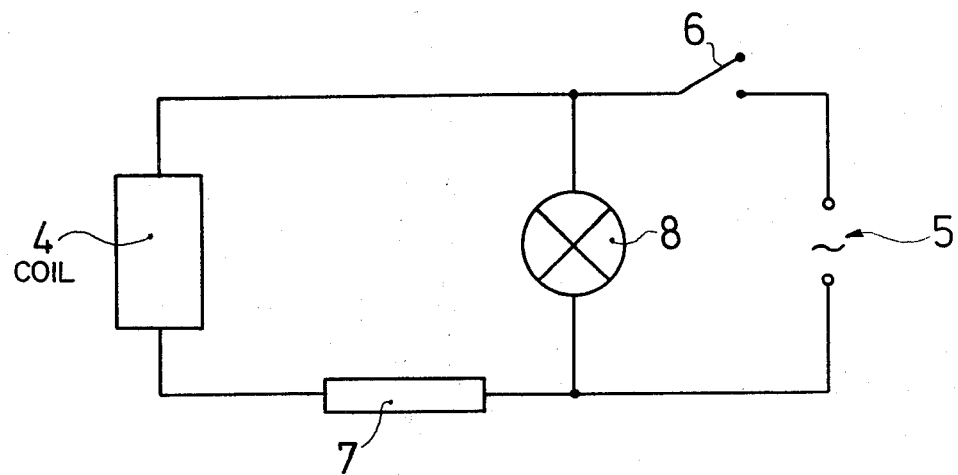
FIG. 2 is an electric winding diagram for operation of the apparatus of FIG. 1.

FIG. 2 shows the coil 4 connected in an electric circuit to an alternating current mains 5, a switch 6 and a resistor 7 being series-connected in the circuit to the coil 4, and a glim lamp 8 being in parallel connection with respect to the coil 4.

Figure 4:
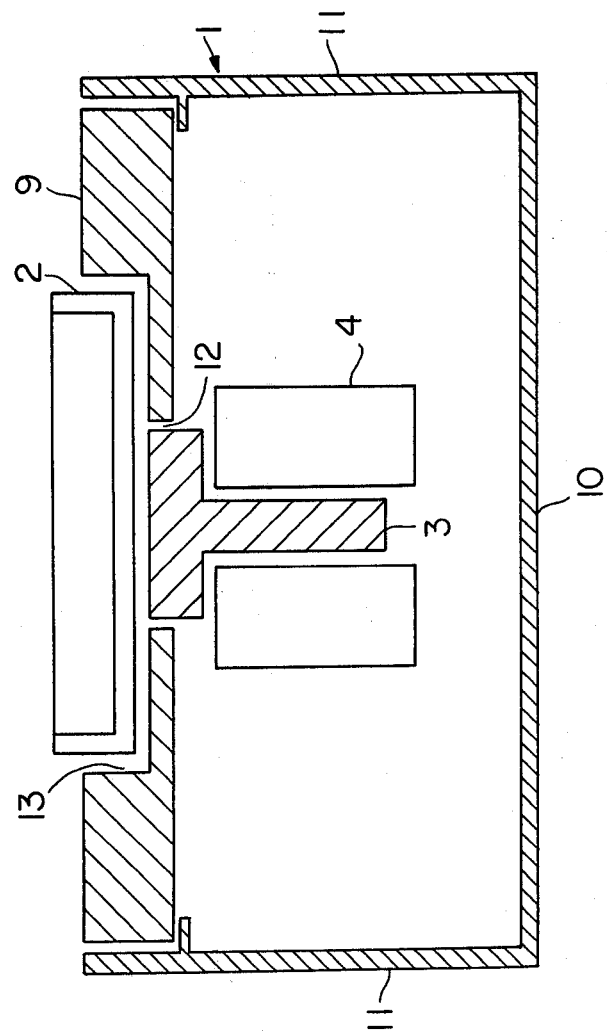
FIG. 4 represents a longitudinal section through the apparatus of FIG. 1.

As shown in FIG. 4 arranged in the housing 1 having a bottom 10 and side walls 11 made up of metal and a cover 9 consisting of plastic material is the coil 4 with the iron core 3. The central portion of the cover 9 is provided with an opening 12 receiving the upper part of the iron core 3. Worked in the cover 9 concentrically with respect to the opening 12 is a groove 13. The groove 13 provides support for a Petri dish 2 of glass as a circular plate which receives the ferromagnetic powders to be tested.

Figure 3:
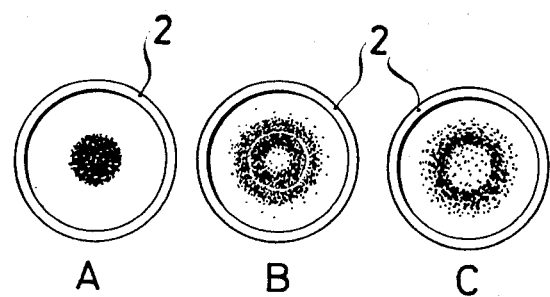
FIG. 3 represents top plan photographs of the apparatus of FIG. 1.

As shown in FIG. 3, the outermost black circles represent in each case the marginal portion of the Petri dish 2 of FIG. 1, the inner blackened zones representing the ferromagnetic material. Photograph A shows a closed figure around the center portion and photograph B shows traces of a narrow light ring concentric to a lighter inner zone. Photograph C finally shows a relatively wide bright inner zone surrounded by a ring of ferromagnetic material.

The ferromagnetic material shown by photograph A is extremely well suitable for use as a heavy medium.

The ferromagnetic material of photograph B is of limited use only, and that of photograph C is unsuitable for use as a heavy medium.

EXAMPLE 1

Ferrosilicon powder which contained 12% Si and 0.7% P was first magnetized in a magnetic steady field at a field strength of 600 amperes per cm and then demagnetized in a cyclicly decreasing alternating field at a field strength of 1000 amperes per cm. 0.3 g of the ferrosilicon powder so pretreated was placed on the center portion of a Petri dish 9 cm in diameter; as shown in FIG. 1, the Petri dish was carried by a supporting iron core which was inserted in a magnetic coil with 2000 windings. Across a series resistor of 700 ohms, an alternating current voltage of 220 volts was applied to the coil.

The magnetic alternating field strength in the center portion of the Petri dish was 200 amperes per cm.

Under the influence of the coil section, the ferrosilicon powder was found to become arranged in the form of a closed figure around the center portion of the Petri dish, as shown in photograph A. The powder so tested was found to be of unlimited use in the preparation of heavy medium suspensions for the float sink dressing of minerals.

EXAMPLE 2

Ferrosilicon powder which contained 12% Si and 3.6% P was tested as in Example 1. Under the influence of the coil section, two circular rings of ferrosilicon powder were found to be formed around the center portion, which remained free, of the Petri dish (cf. photograph B). In other words, the powder tested was of limited use only as a heavy medium.

EXAMPLE 3

Ferrosilicon powder which contained 12% Si and 6% P was tested as in Example 1. Under the influence of the coil section, the ferrosilicon powder was found to form a circular ring wide in diameter around the center portion, which remained free, of the Petri dish (cf. photograph C). The powder tested was unsuitable for use as a heavy medium.

We claim:

1. A method permitting ferromagnetic powders to be tested for their qualification for use as heavy media in the float-sink dressing of minerals, which comprises:
    (a) magnetizing the ferromagnetic powder in a magnetic steady field at a field strength within the range 600 to 1000 amperes per cm;
    (b) demagnetizing the magnetized ferromagnetic powder in a cyclicly decreasing magnetic alternating field at a field strength within the range 1000 to 1500 amperes per cm;
    (c) heaping up, in the center portion of a circular plate made from dielectric material, 0.2 to 0.5 g of the ferromagnetic powder pretreated as described under (a) and (b);
    (d) placing the circular plate described under (c) on an iron core-provided coil, applying an alternating current voltage of 180 to 260 volts thereto, thereby effecting the occurrence of alternating fields of 180 to 220 amperes per cm in the center portion of the circular plate; and
    (e) observing the heaped ferromagnetic powder for the figure it is forming under the influence of the alternating fields according to (d), the formation of a closed figure around the center portion of the plate indicating unlimited qualification of the ferromagnetic powder for use in a heavy medium suspension.

2. The method as claimed in claim 1, wherein glass is used as the dielectric material.

* * * * *